United States Patent
Chen et al.

(10) Patent No.: US 9,012,929 B2
(45) Date of Patent: Apr. 21, 2015

(54) LIGHT SOURCE MODULE

(71) Applicants: Cheng-Yen Chen, Tainan (TW); Yun-Li Li, Tainan (TW); Yi-Hao Huang, Tainan (TW); Sheng-Yuan Sun, Tainan (TW)

(72) Inventors: Cheng-Yen Chen, Tainan (TW); Yun-Li Li, Tainan (TW); Yi-Hao Huang, Tainan (TW); Sheng-Yuan Sun, Tainan (TW)

(73) Assignee: Genesis Photonics Inc., Tainan (TW)

( * ) Notice: Subject to any disclaimer, the term of this patent is extended or adjusted under 35 U.S.C. 154(b) by 38 days.

(21) Appl. No.: 13/904,027

(22) Filed: May 29, 2013

(65) Prior Publication Data
US 2014/0167077 A1    Jun. 19, 2014

(30) Foreign Application Priority Data
Dec. 17, 2012    (TW) .............................. 101224443 U

(51) Int. Cl.
H01L 33/00    (2010.01)
H01L 25/075   (2006.01)
H01L 33/20    (2010.01)

(52) U.S. Cl.
CPC ............ H01L 25/0753 (2013.01); H01L 33/20 (2013.01)

(58) Field of Classification Search
USPC ....................... 257/88, 98, E33.068
See application file for complete search history.

(56) References Cited

U.S. PATENT DOCUMENTS

2008/0259241 A1 * 10/2008 Morimoto ....................... 349/62

FOREIGN PATENT DOCUMENTS

JP         2004-312049      * 4/2004

* cited by examiner

*Primary Examiner* — Victor A Mandala
(74) *Attorney, Agent, or Firm* — Jianq Chyun IP Office

(57) ABSTRACT

A light source module includes a substrate, at least two light emitting diode (LED) chips and at least one dummy chip. The LED chips are disposed on the substrate. The dummy chip is disposed on the substrate and located between the LED chips. The LED chips, the dummy chip and the substrate are electrically connected to one another. The dummy chip is used to redirect a lateral light emitted from the LED chips.

10 Claims, 2 Drawing Sheets

LIGHT SOURCE MODULE

CROSS-REFERENCE TO RELATED APPLICATION

This application claims the priority benefit of Taiwan application serial no. 101224443, filed on Dec. 17, 2012. The entirety of the above-mentioned patent application is hereby incorporated by reference herein and made a part of this specification.

BACKGROUND OF THE INVENTION

1. Field of Invention

The present invention relates to a light source module, and more particularly to a light source module using a light emitting diode chip (LED) as a light source.

2. Description of Related Art

Owing to numerous advantages such as long life span, miniature size, high vibration and shock resistance, low heat emissivity, economical power consumption and so on, LEDs have been widely applied to indicating lights or light sources employed in a variety of household electric appliances and instruments. In recent years, the LEDs have been developed towards high power; therefore, its application scope has been expanded to large outdoor display boards, traffic signal lights, and the like. In the future, the LEDs may even become the main illumination light source with both power-saving and environment-protecting functions.

Generally speaking, an LED light source module is formed by disposing a plurality of LED chips arranged in an array on a substrate. However, the lateral light emitted from two adjacent LED chips would be absorbed by each other, causing that the laterally emitted light from the LED chips can not be utilized. Thereby, the light emitting efficiency of the LED light source module is reduced.

SUMMARY OF THE INVENTION

The invention is directed to a light source module having a dummy chip located between the LED chips, in which the dummy chip can be used for redirecting the lateral light emitted from the LED chips.

The invention provides a light source module including a substrate, at least two LED chips, and at least one dummy chip. The LED chips are disposed on the substrate. The dummy chip is disposed on the substrate and located between the LED chips. The LED chips, the dummy chip and the substrate are electrically connected to one another. The dummy chip is used for redirecting the lateral light emitted from the LED chips.

According to one embodiment of the present invention, the substrate includes a transparent substrate.

According to one embodiment of the present invention, each of the dummy chip has a cross-section with a shape of a ladder, a rectangle, a triangle, or a quadrangle having arc sidewalls.

According to one embodiment of the present invention, a sidewall of each of the dummy chip has a reflectivity greater than 85%.

According to one embodiment of the present invention, a sidewall of each of the dummy chip has a rough surface.

According to one embodiment of the present embodiment, each of the dummy chip is separated from an adjacent one of the LED chips by a distance, and the distance is from 0.5H to H·tan($\theta$/2), in which H is a height of the adjacent one of the LED chips and $\theta$ is a maximum light emitting angle of the adjacent one of the LED chips.

According to one embodiment of the present embodiment, the distance is from H to 6H.

According to one embodiment of the present embodiment, each of the dummy chip has a first electrode and a second electrode such that the each of the dummy chip is electrically connected to the substrate through the first electrode and the second electrode.

According to one embodiment of the present invention, the at least one dummy chip comprises a plurality of flip-chip type dummy chips.

According to one embodiment of the present invention, the at least two LED chips comprise a plurality of flip-chip type LED chips.

According to one embodiment of the present invention, the LED chips respectively emit a light having the same color or different colors.

In view of the above, the light source module according to the invention has a dummy chip located between the LED chips; therefore, the lateral light emitted from the LED chips is not absorbed by the dummy chip, but reflected by the dummy chip so that the lateral light can be redirected. Accordingly, the light source module according to the invention can have improved light emitting efficiency.

Several exemplary embodiments accompanied with figures are described in detail below to further describe the invention in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DESCRIPTION OF EMBODIMENTS

Figure 1A:
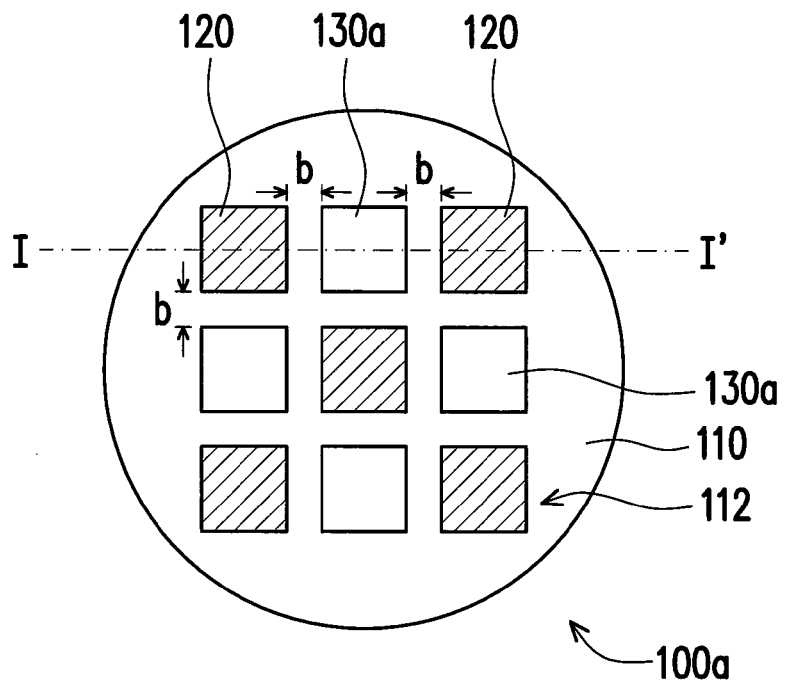
FIG. 1A is a schematic top view of a light source module according to an embodiment of the present invention.
Figure 1B:
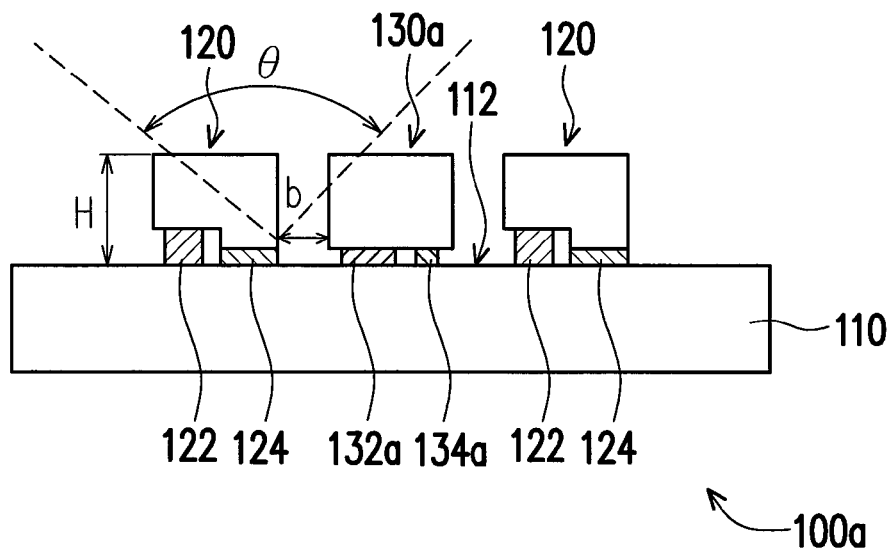
FIG. 1B is a schematic cross-sectional view taken along line I-I' depicted in FIG. 1A.

FIG. 1A is a schematic top view of a light source module according to an embodiment of the present invention. FIG. 1B is a schematic cross-sectional view taken along line I-I' depicted in FIG. 1A. Referring to FIG. 1A, in the present embodiment, a light source module 100a includes a substrate 110, at least two LED chips 120 (five LED chips are illustrated in FIG. 1A for descriptive purpose), and at least one dummy chip 130a (four dummy chips are illustrated in FIG. 1A for descriptive purpose). In details, the LED chips 120 are disposed on a top surface 112 of the substrate 110. The dummy chips 130a are disposed on the top surface 112 of the substrate 110 and located between the LED chips 120. The LED chips 120, the dummy chips 130a and the substrate 110 are electrically connected to one another. Particularly, the dummy chips 130a are used for redirecting a lateral light emitted from the LED chips 120.

More specifically, the substrate 110 is, for example, a transparent substrate, wherein the top surface 112 of the substrate 110 is equipped with a plurality of pads (not shown) and the shape of the substrate 110 can be circular. However, the invention is not limited thereto. The electrodes 122 and 124 of the LED chips 120 are disposed on the pads of the substrate 110 so that the LED chips 120 can be electrically connected to the substrate 110 through the electrodes 122 and 124. Herein, the LED chips 120 can be a plurality of flip-chip type LED chips. The LED chips 120 can respectively emit a light having the same color or different colors. In addition, the sidewall of the dummy chips 130a can be a rough surface, wherein the rough surface can be made by performing a particle coating, a bombard process, a sputter process, a plasma process or an ozone process. Preferably, the sidewall of the dummy chips 130a can have a reflectivity greater than 85% in the present embodiment.

Referring to FIG. 1B, each of the dummy chips 130a in the present embodiment is separated from an adjacent one of the LED chips 120 by a distance b which is from 0.5H to H·tan($\theta$/2), wherein H is a height of LED chips 120 and $\theta$ is a maximum light emitting angle of the LED chips 120. Preferably, the distance b is from H to 6H. Each of the dummy chips 130a has a first electrode 132a and a second electrode 134a such that the each of the dummy chips 130a is electrically connected to the pads (not shown) of the substrate 110 through the first electrode 132a and the second electrode 134a. Herein, the dummy chips 130a can be a plurality of flip-chip type dummy chips. The cross-section of each dummy chip 130a can have a shape of a rectangle, for instance. It is noted that the dummy chips 130a are chips without light emitting function. In addition, as shown in FIG. 1A, the LED chips 120 and the dummy chips 130a are arranged in an array, but the invention is not limited thereto.

The light source module 100a according to the present embodiment has the dummy chips 130a located between the LED chips 120; therefore, the lateral light emitted from the LED chips 120 is not absorbed by the dummy chips 130a, but reflected by the dummy chips 130a so that the lateral light can be redirected. In other words, the lateral light emitted from the LED chips 120 can emit to the dummy chips 130a and then be reflected by the dummy chips 130a so as to emit outward directly. Accordingly, the light source module 100a according to the present embodiment can have improved light emitting efficiency.

Figure 2:
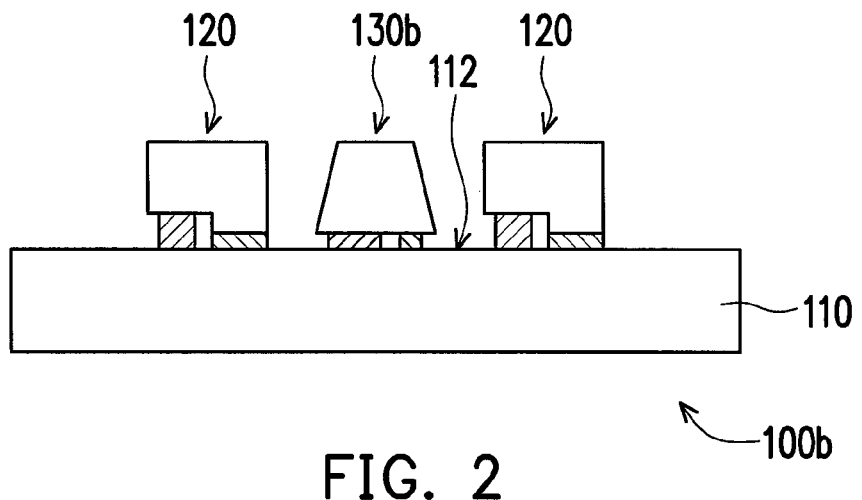
FIG. 2 is a schematic cross-sectional view of a light source module according to an embodiment of the present invention.
Figure 3:
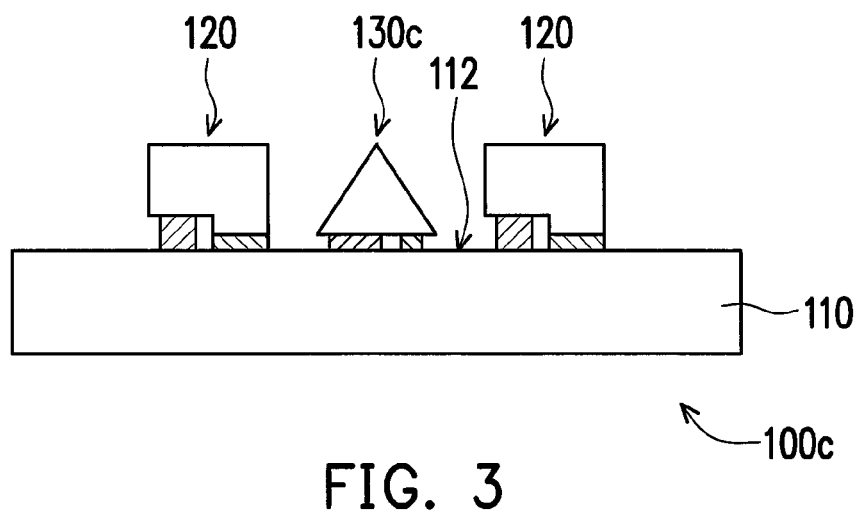
FIG. 3 is a schematic cross-sectional view of a light source module according to another embodiment of the present invention.
Figure 4:
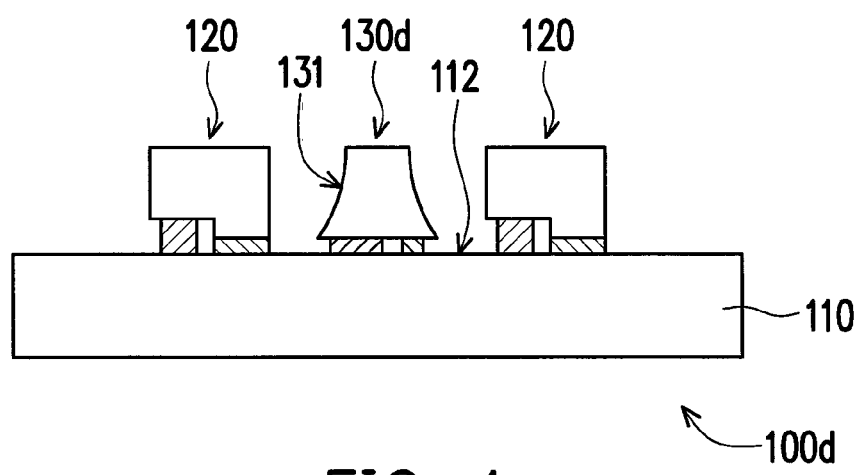
FIG. 4 is a schematic cross-sectional view of a light source module according to further another embodiment of the present invention.

It is noted that the dummy chips 130a having the cross-section of a rectangle shape herein is taken as an example, but the shape of the cross-section of the dummy chips 130a is not particularly limited. For example, in another embodiment, referring to FIG. 2, the cross-section of the dummy chip 130b can have a shape of ladder; alternately, referring to FIG. 3, the cross-section of the dummy chip 130c can have a shape of triangle. Furthermore, referring to FIG. 4, the cross-section of the dummy chip 130d can have a shape of quadrangle with arc sidewalls 131. Said embodiments still belong to a technical means adoptable in the present invention and fall within the protection scope of the present invention.

In view of the above, the light source module according to the invention has a dummy chip located between the LED chips; therefore, the lateral light emitted from the LED chips is not absorbed by the dummy chip, but reflected by the dummy chip so that the lateral light can be redirected. Accordingly, the light source module according to the invention can have improved light emitting efficiency.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A light source module, comprising:
a substrate;
at least two light emitting diode (LED) chips disposed on the substrate; and
at least one dummy chip disposed on the substrate and located between the LED chips, wherein the at least two LED chips, the at least one dummy chip and the substrate are electrically connected to one another, the at least two LED chips comprise a plurality of flip-chip type LED chips, and the at least one dummy chip redirects a lateral light emitted from the at least two LED chips.

2. The light source module as recited in claim 1, wherein the substrate comprises a transparent substrate.

3. The light source module as recited in claim 1, wherein each of the dummy chip has a cross-section with a shape of a ladder, a rectangle, a triangle, or a quadrangle having arc sidewalls.

4. The light source module as recited in claim 1, wherein a sidewall of each of the dummy chip has a reflectivity greater than 85%.

5. The light source module as recited in claim 1, wherein a sidewall of each of the dummy chip has a rough surface.

6. The light source module as recited in claim 1, wherein each of the dummy chip is separated from an adjacent one of the LED chips by a distance, and the distance is from 0.5H to H·tan($\theta$/2), in which H is a height of the adjacent one of the LED chips and $\theta$ is a maximum light emitting angle of the adjacent one of the LED chips.

7. The light source module as recited in claim 6, wherein the distance is from H to 6H.

8. The light source module as recited in claim 1, wherein each of the dummy chips has a first electrode and a second electrode such that the each of the dummy chip is electrically connected to the substrate through the first electrode and the second electrode.

9. The light source module as recited in claim 1, wherein the at least one dummy chip comprises a plurality of flip-chip type dummy chips.

10. The light source module as recited in claim 1, wherein the LED chips respectively emit a light having the same color or different colors.

* * * * *